(12) United States Patent
Cho

(10) Patent No.: US 7,741,138 B2
(45) Date of Patent: Jun. 22, 2010

(54) SEMICONDUCTOR DEVICE AND FABRICATING METHOD THEREOF

(75) Inventor: Yong-Soo Cho, Soo-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 23 days.

(21) Appl. No.: 12/197,269

(22) Filed: Aug. 24, 2008

(65) Prior Publication Data
US 2009/0057760 A1  Mar. 5, 2009

(30) Foreign Application Priority Data
Aug. 29, 2007  (KR)  .............. 10-2007-0087002

(51) Int. Cl.
*H01L 21/00*  (2006.01)
(52) U.S. Cl. ............... 438/41; 257/E21.09; 438/300; 438/44
(58) Field of Classification Search ............ 257/E21.09; 438/300, 41, 44, 525, 302
See application file for complete search history.

(56) References Cited
U.S. PATENT DOCUMENTS

| | | | |
|---|---|---|---|
| 7,132,719 B2 * | 11/2006 | Koh | 257/408 |
| 7,179,696 B2 | 2/2007 | Chakravarthi et al. | |
| 7,211,859 B2 * | 5/2007 | Cho | 257/327 |
| 7,432,559 B2 * | 10/2008 | Lai et al. | 257/377 |
| 2003/0215992 A1 * | 11/2003 | Sohn et al. | 438/199 |
| 2006/0220114 A1 * | 10/2006 | Miyashita et al. | 257/335 |
| 2007/0131969 A1 | 6/2007 | Sanuki et al. | |
| 2008/0242032 A1 * | 10/2008 | Chakravarthi et al. | 438/285 |

FOREIGN PATENT DOCUMENTS

KR  10-2006-0072411  6/2006
KR  10-2006-0079356  7/2006

* cited by examiner

*Primary Examiner*—N Drew Richards
*Assistant Examiner*—Yu-Hsi Sun
(74) *Attorney, Agent, or Firm*—Sherr & Vaughn, PLLC

(57) ABSTRACT

A semiconductor device and fabricating method thereof are disclosed, by which channel mobility is enhanced and by which effect of flicker noise can be minimized. Embodiments relate to a method of fabricating a semiconductor device which includes forming a first epi-layer over a substrate, forming a second epi-layer over the first epi-layer, forming a gate electrode over the second epi-layer, forming a spacer over both sides of the gate electrode, etching an area adjacent both sides of the spacer to a depth of the substrate, forming an LDD region in a region under the spacer, and forming a third epi-layer for a source/drain region over the etched area adjacent both of the sides of the spacer.

16 Claims, 3 Drawing Sheets

SEMICONDUCTOR DEVICE AND FABRICATING METHOD THEREOF

Figure 1:
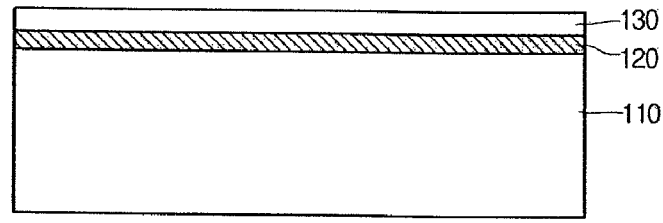

The present application claims priority under 35 U.S.C. 119 to Korean Patent Application No. 10-2007-0087002 (filed on Aug. 29, 2007), which is hereby incorporated by reference in its entirety.

BACKGROUND

Generally, as semiconductor devices become more highly integrated, performing fabrication processes gets more difficult. For instance, in a MOS transistor, as a gate/source/drain electrode is reduced in size, the length of a channel is reduced as well. As the channel length is reduced, a thickness of a gate insulating layer is reduced as well, reducing the mobility of electrons.

Moreover, as the concentration of channel impurities rises, flicker noise increases to affect analog signal characteristics. Therefore, in manufacturing semiconductor devices for SoC (system on chip) technology, it is difficult to ensure reliability of operation. The flicker noise is a sort of intrinsic noise in an active device. As flicker noise is inversely proportional to frequency, it may be called '1/f noise'. The flicker noise rapidly increases on a low frequency band. The flicker noise is associated with electron mobility, channel impurity and the like. In an SoC for a stable radio frequency signal, the flicker noise may cause a serious problem.

SUMMARY

Embodiments relate to a semiconductor technology, and more particularly, to a semiconductor device and fabricating method thereof. Embodiments relate to a semiconductor device and fabricating method thereof, by which channel mobility is enhanced and by which effect of flicker noise can be minimized.

A semiconductor device according to embodiments includes a first epi-layer over a substrate, a second epi-layer over the first epi-layer, a gate electrode over the second epi-layer, a spacer over both sides of the gate electrode, and an LDD region formed under the spacer and to a depth of the first epi-layer. The first epi-layer may include an epitaxial layer doped with channel impurity and the second epi-layer may include an undoped epitaxial layer not containing channel impurity. The semiconductor may further include a third epi-layer next to both sides of the spacer and over an etched portion of the substrate including the first and second epi-layers to become a source/drain region.

Embodiments relate to a method of fabricating a semiconductor device which includes forming a first epi-layer over a substrate, forming a second epi-layer over the first epi-layer, forming a gate electrode over the second epi-layer, forming a spacer over both sides of the gate electrode, etching an area adjacent both sides of the spacer to a depth of the substrate, forming an LDD region in a region under the spacer, and forming a third epi-layer for a source/drain region over the etched area adjacent both of the sides of the spacer.

The spacer forming step may include forming an oxide layer over the second epitaxial layer adjacent both sides of the gate electrode, forming a first nitride layer over the gate electrode the nitride layer having a width greater than that of the gate electrode, and extending over the top of the oxide layer, and removing a portion of the oxide layer using the first nitride layer as a mask. The first nitride layer may be further used as a mask in etching the first nitride layer in part to the depth of the substrate after forming the spacer.

After etching the area adjacent both of the sides of the spacer to the depth of the substrate, the method may further include applying a stress to the substrate exposed by the etching step in a vertical direction. Applying the stress to the substrate in the vertical direction may include forming a second nitride layer over the substrate including the gate electrode and the spacer.

The stress may be applied to the exposed substrate in a vertical direction to enable the stress to be memorized in a channel region of the gate electrode.

DRAWINGS

Example FIG. 1 is a cross-sectional diagram of a semiconductor device according to embodiments after a second epitaxial layer has been formed.

Figure 2:
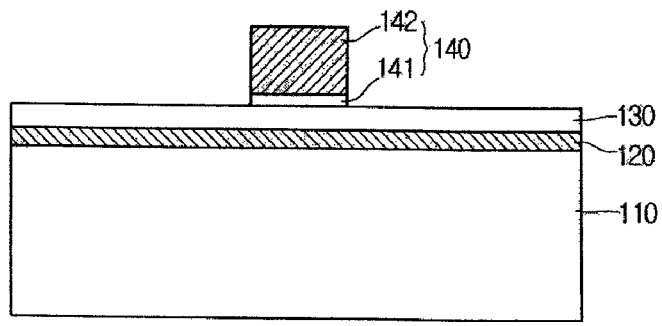

Example FIG. 2 is a cross-sectional diagram of a semiconductor device according to embodiments after a gate electrode has been formed.

Figure 3:
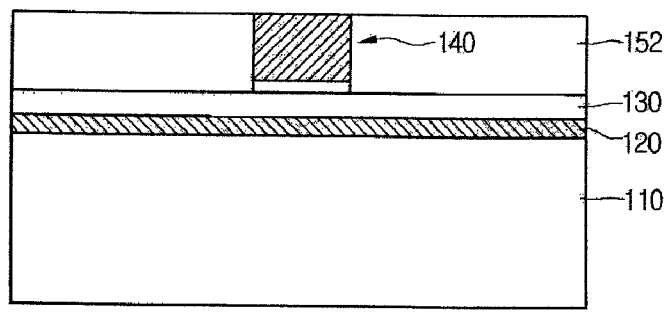

Example FIG. 3 is a cross-sectional diagram of a semiconductor device according to embodiments after an oxide layer has been formed.

Figure 4:
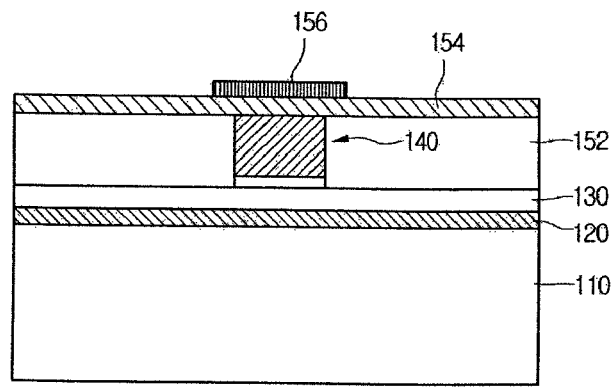

Example FIG. 4 is a cross-sectional diagram of a semiconductor device according to embodiments after a nitride layer and a photoresist layer have been formed.

Figure 5:
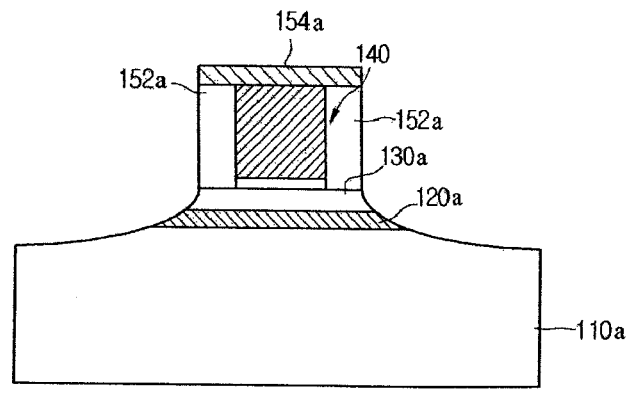

Example FIG. 5 is a cross-sectional diagram of a semiconductor device according to embodiments after an oxide layer and a portion of a substrate have been removed.

Figure 6:
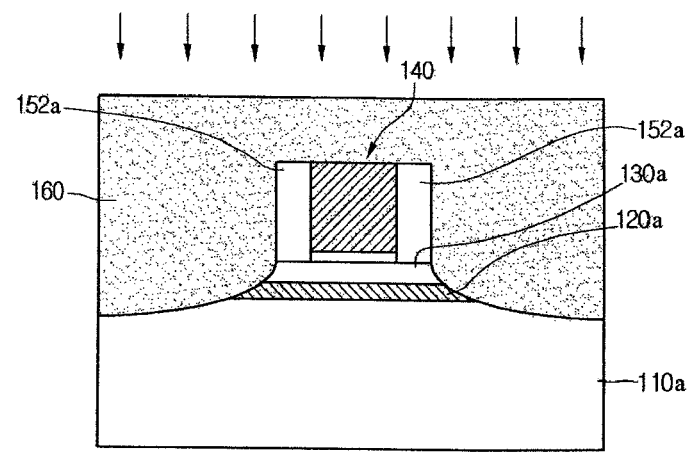

Example FIG. 6 is a cross-sectional diagram of a semiconductor device according to embodiments after a second nitride layer has been formed.

Figure 7:
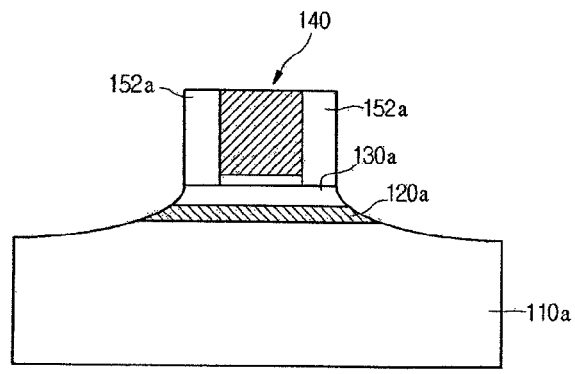

Example FIG. 7 is a cross-sectional diagram of a semiconductor device according to embodiments after a second nitride layer has been removed.

Figure 8:
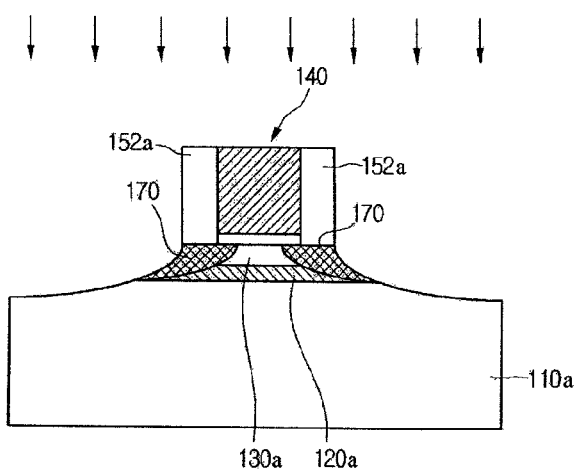

Example FIG. 8 is a cross-sectional diagram of a semiconductor device according to embodiments after an LDD region has been formed.

Figure 9:
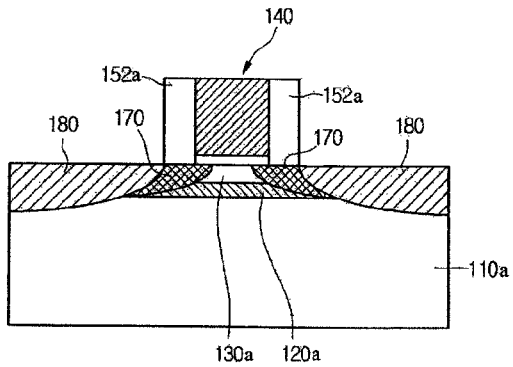

Example FIG. 9 is a cross-sectional diagram of a completed semiconductor device according to embodiments.

DESCRIPTION

Example FIG. 1 is a cross-sectional diagram of a semiconductor device according to embodiments after a second epitaxial layer 130 has been formed. Referring to example FIG. 1, a first epi-layer 120 heavily doped with channel impurity is grown over a semiconductor substrate 110, e.g., a monocrystalline silicon substrate. The first epi-layer 120 may contain channel impurity levels between about $2 \times 10^{13}$ ions/cm$^2$ to $2 \times 10^{16}$ ions/cm$^2$. In NMOS transistors, for example, the channel impurity may include boron (B) or the like. In PMOS transistors, for example, the channel impurity may include As, P or the like.

After the first epi-layer 120 has been grown and doped with the channel impurity, a second epi-layer 130 may be grown over the first epi-layer 120. The second epi-layer 130 is not doped with impurity. Each of the epi-layers 120 and 130 may have the same thickness, which may be about 10 nm~30 nm. After the first and second epi-layers, which correspond to a epitaxial layer doped with channel impurity and an epitaxial layer undoped with channel impurity, respectively, have been formed, a gate electrode 140 explained in the following description may be formed.

Example FIG. 2 is a cross-sectional diagram of a semiconductor device according to embodiments after a gate electrode has been formed. Referring to example FIG. 2, to form a gate electrode 140, a gate oxide may be grown over the second epi-layer 130. The gate oxide may then be coated with polysilicon. A gate electrode 140 may be formed using a photoresist and a dry etch process in turn. The gate oxide etched by the dry etch process becomes a gate insulating layer 141 and the etched polysilicon becomes an electrode 142. In the following description, the term gate electrode 140 will refer to both gate insulating layer 141 and electrode 142. The gate electrode 140 may be approximately 130 nm~170 nm tall.

Example FIG. 3 is a cross-sectional diagram of a semiconductor device according to embodiments after an oxide layer 152 has been formed. Referring to example FIG. 3, an oxide layer 152 may be formed over both sides of the gate electrode 140 by deposition and planarization. In particular, after the gate electrode 140 has been formed, oxide may be deposited over the second epi-layer 130 including the gate electrode 130. The oxide may be deposited by CVD (Chemical Vapor Deposition). The oxide may be polished by planarization such as CMP (Chemical Mechanical Polishing) until a top surface of the gate electrode 140 is exposed.

Example FIG. 4 is a cross-sectional diagram of a semiconductor device according to embodiments after a nitride layer 154 and a photoresist layer 156 have been formed. Referring to example FIG. 4, after completion of the planarization performed over the oxide to form the oxide layer 152 over both sides of the gate electrode 140, a first nitride 154 may be formed over the oxide layer 152 including the gate electrode 140. A photoresist layer 156 may be formed to cover the gate electrode 140 and a portion of the first nitride 154 over both sides of the gate electrode 140. The photoresist layer 156 may be formed to have a width greater than that of the gate electrode 140. More particularly, the photoresist layer 156 may be formed to extend from both sides of the gate electrode 140 by about 45 nm~55 nm.

The photoresist layer 156 may be used as a mask to etch the first nitride 154. A first nitride layer 154a may be formed by etching, using the photoresist layer 156. The first nitride layer 154a (shown in FIG. 5) may formed with a width greater than that of the gate electrode 140 to extend over the oxide layer 152. The first nitride layer 154a may be used as an etch mask to form a dummy spacer.

Example FIG. 5 is a cross-sectional diagram of a semiconductor device according to embodiments after an oxide layer and a portion of a substrate have been removed. Referring to example FIG. 5, after the first nitride layer 154a has been formed by etching, using the photoresist layer 156 as a mask, the photoresist layer 156 may be removed. A portion of the oxide layer 152 may be removed by a first dry etching process using the first nitride layer 154a as a mask. The portion of the oxide layer remaining over both sides of the gate electrode 140 becomes a dummy spacer 152a.

After the portion of the oxide layer 152 has been removed, a second dry etch process using the first nitride layer 154a as a mask may be performed. In the second dry etch process, the substrate 110 may be etched to a depth of approximately 95 nm~105 nm from a surface of the substrate 110. Therefore, a portion of the substrate 110 including the first and second epi-layers 120 and 130 not covered with both sides of the spacer 152a may be removed. The nitride layer 154a, which was used as the etch masks in forming the dummy spacer 152a and removing the portion of the substrate 110 including the first and second epi-layers 120 and 130, may be removed.

Example FIG. 6 is a cross-sectional diagram of a semiconductor device according to embodiments after a second nitride layer 160 has been formed, and example FIG. 7 is a cross-sectional diagram of a semiconductor device according to embodiments after a second nitride layer 160 has been removed. After the first nitride layer 154a has been removed, a second nitride layer 160 may be formed over the partially-etched substrate 110a including the gate electrode 140 and the spacer 152a to apply a vertical stress to the substrate 110a exposed by the etch. The stress may be concentrated vertically with respect to a channel region under the gate electrode 140 by high-temperature annealing. The stress may be memorized in the channel region of the gate electrode 140. The second nitride layer 160 may be formed of SIN based material. After completion of the channel memorizing process of stress, the second nitride layer 160 may be removed. By memorizing the stress in the channel region, the channel region of the gate electrode 140 is activated, and electron mobility is enhanced in the channel region.

Example FIG. 8 is a cross-sectional diagram of a semiconductor device according to embodiments after an LDD region 170 has been formed. After the second nitride layer 160 has been removed, an LDD region 170 may be formed by ion implantation. For instance, in forming a p-type LDD region, ion implantation may be performed using $BF_2$ ions with 5 KeV~50 KeV energy and a dose of $1\times10^{14}$~$5\times10^{15}$ ions/cm$^2$. In forming an n-type LDD region, ion implantation may be performed using As ions with 10 KeV~70 KeV energy and a dose of $1\times10^{14}$~$5\times10^{15}$ ions/cm$^2$. With the above LDD structure, the drain-gate voltage around the channel region and the source/drain junction is mitigated and the considerable potential fluctuation is reduced. Therefore, the LDD structure helps suppress the hot-carrier generation.

By controlling the ion implantation energy, the first epi-layer 120 and the substrate 110 may be made to confine the LDD region 170. In other words, the LDD region 170 can be defined according to the configuration of the first epi-layer 120a etched together with the substrate 110. Therefore, the LDD region 170 may be formed under the spacer 152a and to the depth of the first epi-layer 120a etched by the second dry etch process.

Example FIG. 9 is a cross-sectional diagram of a semiconductor device according to embodiments after completion of fabrication. After the LDD region 170 has been formed, a third epi-layer 180 may be formed to cover the portion of the substrate etched by the second dry etch process. The third epi-layer 180 may be formed to have the same height of the bottom of the spacer 152a. In particular, the third epi-layer 180 may be formed over the etched substrate areas next to both sides of the spacer 152a. Each of the substrate areas functions as a source/drain region. More particularly, the third epi-layer 180 may be formed over the etched portion of the substrate 110 including the first and second epi-layers 120a and 130a neighbor to both sides of the spacer 152a by the second dry etch process.

Subsequently, a silicide layer may be formed over the third epi-layer 180 of the source/drain region and the gate electrode 140 by salicidation. A series of subsequent processes, for example, for contacts, metal wires and the like, may then be performed. Details for the subsequent processes will be omitted for lack of relevance to embodiments.

Accordingly, embodiments provide the following effects and/or advantages. Embodiments intensively apply stress with a nitride layer to a channel region using channel memorization, thereby enhancing the mobility of electrons. Embodiments form a multi-layered epi-layer structure in a channel region, thereby reducing the dose of channel impurity and also thereby enhancing electron mobility. Therefore, embodiments maximize device reliability even if a semiconductor device is integrated at the level of tens of nanometers or below. Embodiments minimize influence caused by flicker noise, thereby enhancing the analog characteristics of a device. In applying the SoC technology to a semiconductor device, embodiments minimize the influence of interference signals between neighbor devices.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method comprising:
   forming a first epi-layer over a substrate;
   forming a second epi-layer over the first epi-layer;
   forming a gate electrode over the second epi-layer;
   forming a spacer over both sides of the gate electrode;
   etching an area adjacent both sides of the spacer to a depth of the substrate;
   ion implanting an LDD region in a region under the spacer after said etching; and
   forming a third epi-layer for a source/drain region over the etched area adjacent both of the sides of the spacer.

2. The method of claim 1, wherein the first epi-layer is doped with channel impurity.

3. The method of claim 1, wherein the second epi-layer is formed without additional channel dopants.

4. The method of claim 1, wherein the first and second epi-layers are substantially the same thickness.

5. The method of claim 4, wherein each of the first and second epi-layers is between 10 and 30 nm thick.

6. The method of claim 1, wherein forming a spacer over both sides of the gate electrode comprises:
   forming an oxide layer over the second epitaxial layer adjacent both sides of the gate electrode;
   forming a first nitride layer over the gate electrode, the nitride layer having a width greater than that of the gate electrode, and extending over the top of the oxide layer; and
   removing a portion of the oxide layer using the first nitride layer as a mask.

7. The method of claim 6, wherein the first nitride layer is further used as a mask in etching the first and second epi-layers to the depth of the substrate after forming the spacer.

8. The method of claim 7, wherein the first nitride layer is removed after etching the first and second epi-layers to the depth of the substrate.

9. The method of claim 6, wherein the first nitride layer extends beyond the gate electrode by about 45 nm~55 nm.

10. The method of claim 1, wherein after etching the area adjacent both of the sides of the spacer to the depth of the substrate, the method comprises applying a vertical stress to the substrate exposed by the etching.

11. The method of claim 10, the step of applying the stress to the substrate in the vertical direction, comprising the step of forming a second nitride layer over the substrate including the gate electrode and the spacer.

12. The method of claim 11, wherein the second nitride layer is formed of SiN.

13. The method of claim 11, comprising removing the second nitride layer.

14. The method of claim 10, wherein the stress is memorized in a channel region of the gate electrode.

15. The method of claim 10, wherein the gate electrode is formed about 130~170 nm tall.

16. The method of claim 10, wherein the stress is concentrated vertically with respect to a channel region under the gate electrode by high-temperature annealing.

* * * * *